(12) United States Patent
Sugimoto et al.

(10) Patent No.: US 11,760,686 B2
(45) Date of Patent: Sep. 19, 2023

(54) GLASS CERAMIC MATERIAL, LAMINATE, AND ELECTRONIC COMPONENT

(71) Applicant: Murata Manufacturing Co., Ltd., Kyoto (JP)

(72) Inventors: Yasutaka Sugimoto, Kyoto (JP); Sadaaki Sakamoto, Kyoto (JP); Yutaka Senshu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 298 days.

(21) Appl. No.: 17/345,116

(22) Filed: Jun. 11, 2021

(65) Prior Publication Data

US 2021/0309562 A1      Oct. 7, 2021

Related U.S. Application Data

(63) Continuation of application No. PCT/JP2019/049014, filed on Dec. 13, 2019.

(30) Foreign Application Priority Data

Dec. 20, 2018   (JP) .................. 2018-238710

(51) Int. Cl.
*C03C 14/00*        (2006.01)
*H05K 1/03*         (2006.01)
(Continued)

(52) U.S. Cl.
CPC ........ *C03C 10/0054* (2013.01); *C03C 27/044* (2013.01); *H05K 1/0306* (2013.01)

(58) Field of Classification Search
CPC ...... C03C 14/004; C03C 14/006; H05K 1/306
See application file for complete search history.

(56) References Cited

U.S. PATENT DOCUMENTS

| | | | |
|---|---|---|---|
| 5,242,867 A * | 9/1993 | Lin ..................... | H05K 1/0306 257/E23.009 |
| 2011/0001162 A1 | 1/2011 | Nakayama et al. | |

(Continued)

FOREIGN PATENT DOCUMENTS

| CN | 108476593 A | 8/2018 |
|---|---|---|
| JP | 2002-187768 A | 7/2002 |

(Continued)

OTHER PUBLICATIONS

International Search Report for PCT/JP2019/049014 dated Feb. 4, 2020.
Written Opinion for PCT/JP2019/049014 dated Feb. 4, 2020.

*Primary Examiner* — Karl E Group
(74) *Attorney, Agent, or Firm* — Pearne & Gordon LLP

(57) ABSTRACT

The glass ceramic material of the present disclosure contains a glass that contains $SiO_2$, $B_2O_3$, $Al_2O_3$, and $M_2O$, where M is an alkali metal, and a filler that contains quartz, $Al_2O_3$, and $ZrO_2$. The glass ceramic material contains the glass in an amount of 57.4% by weight or more and 67.4% by weight or less, the quartz in the filler in an amount of 29% by weight or more and 39% by weight or less, the $Al_2O_3$ in the filler in an amount of 1.8% by weight or more and 5% by weight or less, and the $ZrO_2$ in the filler in an amount of 0.3% by weight or more and 1.8% by weight or less.

8 Claims, 3 Drawing Sheets

(51) Int. Cl.
*C03C 10/00* (2006.01)
*C03C 27/04* (2006.01)

(56) References Cited

U.S. PATENT DOCUMENTS

| | | |
|---|---|---|
| 2011/0079412 A1 | 4/2011 | Imakita et al. |
| 2016/0088729 A1 | 3/2016 | Kobuke et al. |
| 2016/0254096 A1* | 9/2016 | Adachi .................. C04B 35/18 361/321.4 |
| 2018/0319129 A1 | 11/2018 | Sakamoto et al. |
| 2021/0307162 A1* | 9/2021 | Sakamoto ................ B32B 5/16 |
| 2021/0315100 A1* | 10/2021 | Senshu .................. C03C 3/091 |

FOREIGN PATENT DOCUMENTS

| | | |
|---|---|---|
| JP | 2009-215089 A | 9/2009 |
| JP | 2010-208944 A | 9/2010 |
| JP | 2011-079704 A | 4/2011 |
| JP | 2012-229160 A | 11/2012 |
| JP | 2014-236072 A | 12/2014 |
| JP | 2018-123011 A | 8/2018 |
| WO | 2015/093098 A1 | 6/2015 |
| WO | 2017/122381 A1 | 7/2017 |

* cited by examiner

GLASS CERAMIC MATERIAL, LAMINATE, AND ELECTRONIC COMPONENT

CROSS REFERENCE TO RELATED APPLICATION

This is a continuation of International Application No. PCT/JP2019/049014 filed on Dec. 13, 2019 which claims priority from Japanese Patent Application No. 2018-238710 filed on Dec. 20, 2018. The contents of these applications are incorporated herein by reference in their entireties.

BACKGROUND OF THE DISCLOSURE

Field of the Disclosure

The present disclosure relates to glass ceramic materials, laminates, and electronic components.

Description of the Related Art

Multilayer ceramic substrates have been recently used for applications such as electronic components. With regard to constituent materials usable for multilayer ceramic substrates, Patent Literature 1 discloses a radio-frequency low-temperature-sinterable dielectric material and Patent Literature 2 discloses a glass ceramic material. Patent Literature 3 discloses a laminate applicable to a multilayer ceramic substrate.

Patent Literature 1: JP 2002-187768 A
Patent Literature 2: WO 2015/093098
Patent Literature 3: WO 2017/122381

BRIEF SUMMARY OF THE DISCLOSURE

A multilayer ceramic substrate includes a sintered article of constituent materials and needs to have the following features (1) to (3): (1) a low permittivity and a low dielectric loss so as to deal with electrical signals with higher frequencies; (2) a high mechanical strength so as to be applicable to large electronic components; and (3) a high coefficient of thermal expansion so as to achieve high reliability in mounting onto a board.

Unfortunately, the invention disclosed in Patent Literature 1 needs to be improved in terms of the above features (2) and (3). The invention disclosed in Patent Literature 2 needs to be improved in terms of the above feature (2). The invention disclosed in Patent Literature 3 needs to be improved in terms of the above features (1) and (3).

The present disclosure is made to solve the above issues relating to the features (1) to (3) and aims to provide a glass ceramic material capable of achieving a low permittivity, low dielectric loss, high mechanical strength, and high coefficient of thermal expansion after sintering, a laminate including a sintered article of the glass ceramic material, and an electronic component including a multilayer ceramic substrate including the laminate.

The glass ceramic material of the present disclosure contains a glass that contains $SiO_2$, $B_2O_3$, $Al_2O_3$, and $M_2O$, where M is an alkali metal, and a filler that contains quartz, $Al_2O_3$, and $ZrO_2$, the glass ceramic material containing the glass in an amount of 57.4% by weight or more and 67.4% by weight or less, the quartz in the filler in an amount of 29% by weight or more and 39% by weight or less, the $Al_2O_3$ in the filler in an amount of 1.8% by weight or more and 5% by weight or less, and the $ZrO_2$ in the filler in an amount of 0.3% by weight or more and 1.8% by weight or less.

The laminate of the present disclosure includes multiple glass ceramic layers each of which is a sintered article of the glass ceramic material of the present disclosure.

The electronic component of the present disclosure includes a multilayer ceramic substrate including the laminate of the present disclosure and a chip component mounted on the multilayer ceramic substrate.

The present disclosure can provide a glass ceramic material capable of achieving a low permittivity, low dielectric loss, high mechanical strength, and high coefficient of thermal expansion after sintering, a laminate including a sintered article of the glass ceramic material, and an electronic component including a multilayer ceramic substrate including the laminate.

DETAILED DESCRIPTION OF THE DISCLOSURE

Figure 1:
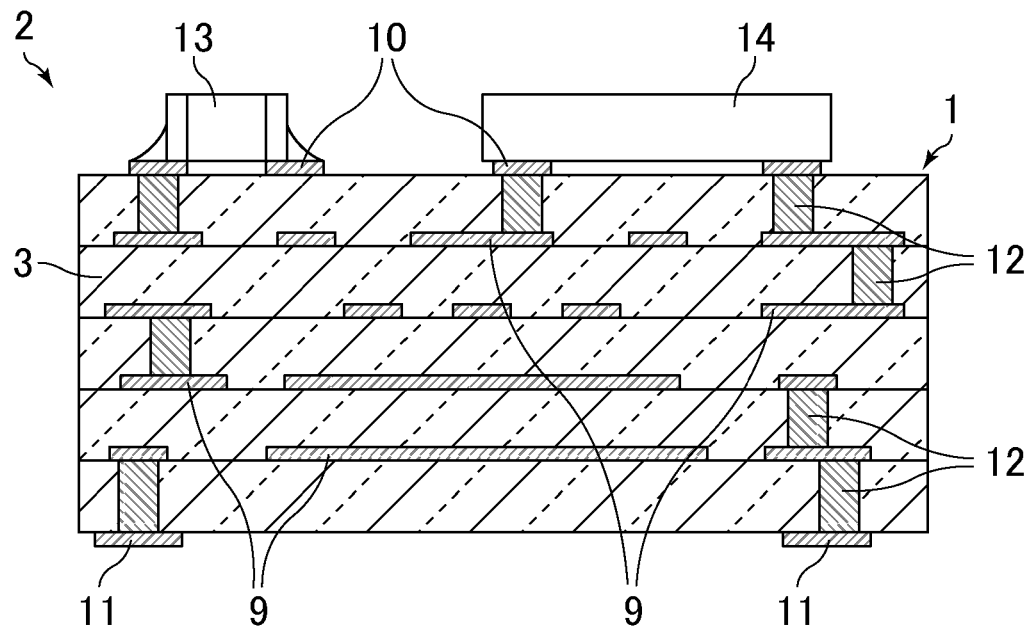
FIG. 1 is a schematic cross-sectional view of an example where the laminate of the present disclosure is applied to a multilayer ceramic substrate.

The glass ceramic material, laminate, and electronic component of the present disclosure are described hereinbelow. However, the present disclosure is not limited to the following structures and may be suitably modified without departing from the gist of the present disclosure. Combinations of two or more preferred structures of the present disclosure described in the following are also within the scope of the present disclosure.

Glass Ceramic Material

The glass ceramic material of the present disclosure contains a glass that contains $SiO_2$, $B_2O_3$, $Al_2O_3$, and $M_2O$, where M is an alkali metal, and a filler that contains quartz, $Al_2O_3$, and $ZrO_2$, the glass ceramic material containing the glass in an amount of 57.4% by weight or more and 67.4% by weight or less, the quartz in the filler in an amount of 29% by weight or more and 39% by weight or less, the $Al_2O_3$ in the filler in an amount of 1.8% by weight or more and 5% by weight or less, and the $ZrO_2$ in the filler in an amount of 0.3% by weight or more and 1.8% by weight or less.

The glass ceramic material of the present disclosure is a low temperature co-fired ceramic (LTCC) material. The "low temperature co-fired ceramic material" herein means a glass ceramic material sinterable at a firing temperature of 1000° C. or lower.

<Glass>

The glass contains $SiO_2$, $B_2O_3$, $Al_2O_3$, and $M_2O$, where M is an alkali metal.

The $SiO_2$ in the glass contributes to a decrease in permittivity when the glass ceramic material is sintered. This results in, for example, reduction of stray capacity due to electrical signals with higher frequencies.

The $B_2O_3$ in the glass contributes to a decrease in glass viscosity. This allows a sintered article of the glass ceramic material to be dense.

The $Al_2O_3$ in the glass contributes to improvement of the chemical stability of the glass.

The $M_2O$ in the glass contributes to a decrease in glass viscosity. This allows a sintered article of the glass ceramic material to be dense. The $M_2O$ may be any alkali metal oxide, and is preferably $Li_2O$, $K_2O$, or $Na_2O$, more preferably $K_2O$. The $M_2O$ may include one alkali metal oxide or may include multiple alkali metal oxides.

The glass preferably contains $SiO_2$ in an amount of 72% by weight or more and 88% by weight or less, $B_2O_3$ in an amount of 10% by weight or more and 26% by weight or less, $Al_2O_3$ in an amount of 0.1% by weight or more and 2% by weight or less, and $M_2O$ in an amount of 1% by weight or more and 3% by weight or less.

The glass preferably has a $SiO_2$ content of 72% by weight or more and 88% by weight or less, more preferably 76% by weight or more and 84% by weight or less.

The glass preferably has a $B_2O_3$ content of 10% by weight or more and 26% by weight or less, more preferably 14% by weight or more and 22% by weight or less.

The glass preferably has an $Al_2O_3$ content of 0.1% by weight or more and 2% by weight or less, more preferably 0.3% by weight or more and 1% by weight or less.

The glass preferably has a $M_2O$ content of 1% by weight or more and 3% by weight or less, more preferably 1.3% by weight or more and 2% by weight or less. In the case where the $M_2O$ includes multiple alkali metal oxides, the sum of the amounts thereof is defined as the $M_2O$ content.

The glass may further contain an alkaline earth metal oxide such as CaO. However, in order to achieve a high $SiO_2$ content in the glass and thereby achieve a low permittivity and low dielectric loss, the glass is preferably free from an alkaline earth metal oxide. Even when an alkaline earth metal oxide is contained, the amount thereof is preferably less than 15% by weight.

The glass may further contain impurities in addition to the above components. The amount of impurities in the glass is preferably less than 5% by weight.

The glass content in the glass ceramic material is 57.4% by weight or more and 67.4% by weight or less, preferably 60% by weight or more and 65% by weight or less.

<Filler>

The filler contains quartz, $Al_2O_3$, and $ZrO_2$. The filler contributes to improvement of mechanical strength when the glass ceramic material is sintered. The "filler" herein means an inorganic additive not contained in the glass.

The quartz in the filler contributes to an increase in coefficient of thermal expansion when the glass ceramic material is sintered. The glass has a coefficient of thermal expansion of about 6 ppm/K, while the quartz has a coefficient of thermal expansion of about 15 ppm/K. Thus, the presence of quartz in the glass ceramic material can lead to a high coefficient of thermal expansion after sintering. This generates a compression stress in the course of cooling after sintering, resulting in a high mechanical strength (e.g., flexural strength), as well as increased reliability in mounting on a board (e.g., resin board).

The glass ceramic material contains the quartz in the filler in an amount of 29% by weight or more and 39% by weight or less, preferably 32% by weight or more and 36% by weight or less.

The glass ceramic material contains the $Al_2O_3$ in the filler in an amount of 1.8% by weight or more and 5% by weight or less, preferably 2.2% by weight or more and 3.5% by weight or less.

The glass ceramic material contains the $ZrO_2$ in the filler in an amount of 0.3% by weight or more and 1.8% by weight or less, preferably 0.5% by weight or more and 1.5% by weight or less.

The presence of $Al_2O_3$ and $ZrO_2$ fillers in the above predetermined amounts in the glass ceramic material can prevent precipitation of cristobalite crystals during sintering. Cristobalite crystal is a type of $SiO_2$ crystal and exhibits phase transition at about 280° C. Thus, precipitation of cristobalite crystals in the course of sintering the glass ceramic material may greatly change the volume in a high-temperature environment, causing reduced reliability. From this viewpoint, the glass ceramic material is preferably free from cristobalite crystals. The expression "free from cristobalite crystals" herein means that the amount of cristobalite crystals is not higher than the detection limit. The presence or absence of precipitation of cristobalite crystals is confirmed by crystal structure analysis such as X-ray diffraction (XRD).

The $Al_2O_3$ and $ZrO_2$ in the filler also contribute to a low dielectric loss, high coefficient of thermal expansion, and high mechanical strength after the glass ceramic material is sintered.

As described above, the glass ceramic material of the present disclosure can achieve a low permittivity, low dielectric loss, high mechanical strength, and high coefficient of thermal expansion after sintering. For a sintered article of the glass ceramic material, the glass and the filler can be distinguished by analyzing the electron diffraction pattern using a transmission electron microscope (TEM).

Laminate

The laminate of the present disclosure includes multiple glass ceramic layers each of which is a sintered article of the glass ceramic material of the present disclosure.

The laminate of the present disclosure preferably has a relative permittivity of 4.5 or lower. The relative permittivity is measured under 6-GHz conditions by the perturbation method.

The laminate of the present disclosure preferably has a Q value, which is the reciprocal of the dielectric loss, of 180 or higher. The Q value is determined as the reciprocal of the dielectric loss measured at 6 GHz by the perturbation method.

The laminate of the present disclosure preferably has a flexural strength, which is an index of the mechanical strength, of 160 MPa or higher. The flexural strength is measured using a 3-point bending tester.

The laminate of the present disclosure preferably has a coefficient of thermal expansion of 8 ppm/K or higher. The coefficient of thermal expansion is measured as an average coefficient of thermal expansion within a temperature range of 20° C. or higher and 600° C. or lower using a thermomechanical analyzer (TMA).

The laminate of the present disclosure may be applied to a multilayer ceramic substrate. FIG. 1 is a schematic cross-sectional view of an example where the laminate of the present disclosure is applied to a multilayer ceramic substrate. As illustrated in FIG. 1, a multilayer ceramic substrate 1 includes multiple (five in FIG. 1) glass ceramic layers 3.

Each of the multiple glass ceramic layers 3 is a sintered article of the glass ceramic material of the present disclosure. Thus, the multilayer ceramic substrate 1 includes the multiple glass ceramic layers 3 each of which is a sintered article of the glass ceramic material of the present disclosure. The compositions of the multiple glass ceramic layers 3 may be the same as or different from each other, and are preferably the same as each other.

The multilayer ceramic substrate 1 may further include a conductive layer. For example, the conductive layer constitutes a passive element such as a capacitor or an inductor or constitutes a connection line to provide an electrical connection between the elements. Examples of the conductive layer include conductive layers 9, 10, and 11, as well as via hole conductor layers 12, as illustrated in FIG. 1.

The conductive layers 9, 10, and 11, as well as via hole conductor layers 12 preferably contain Ag or Cu as a main component. Use of such a low-resistance metal can prevent occurrence of signal propagation delay due to electrical signals with higher frequencies. The constituent material of each glass ceramic layer 3 used is the glass ceramic material of the present disclosure, i.e., a low temperature co-fired ceramic material, and thus can be co-fired with Ag or Cu.

The conductive layers 9 are provided inside the multilayer ceramic substrate 1. Specifically, the conductive layers 9 are provided at the interfaces of glass ceramic layers 3.

The conductive layer 10 is provided on one main surface of the multilayer ceramic substrate 1.

The conductive layer 11 is provided on the other main surface of the multilayer ceramic substrate 1.

Each via hole conductor layer 12 is provided to penetrate a glass ceramic layer 3 and plays roles of electrically connecting conductive layers 9 of different levels, of electrically connecting conductive layers 9 and 10, and of electrically connecting conductive layers 9 and 11.

The multilayer ceramic substrate 1 may be produced as follows, for example.

(A) Preparation of Glass Ceramic Material

Glass (glass containing $SiO_2$, $B_2O_3$, $Al_2O_3$, and $M_2O$), quartz, $Al_2O_3$, and $ZrO_2$ (each in the form of powder) are mixed in a predetermined composition, whereby the glass ceramic material of the present disclosure is prepared.

(B) Production of Green Sheet

The glass ceramic material of the present disclosure is mixed with components such as a binder and a plasticizer, whereby ceramic slurry is prepared. The ceramic slurry is applied in a pattern to a base film (e.g., a polyethylene terephthalate (PET) film) and dried, whereby a green sheet is produced.

(C) Production of Multilayer Green Sheet

Figure 2:
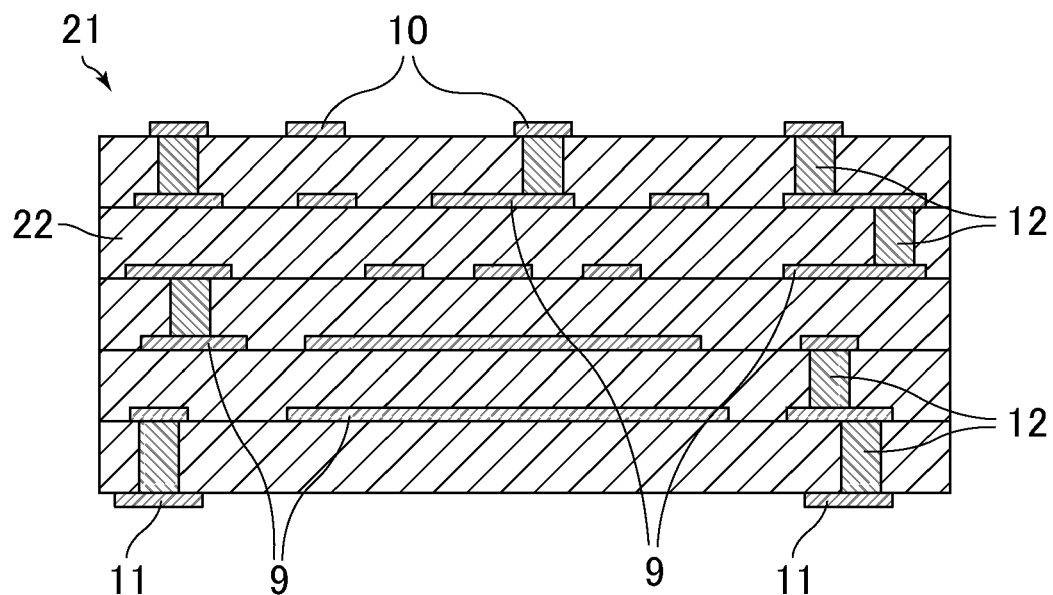
FIG. 2 is a schematic cross-sectional view of a multilayer green sheet (non-fired) produced in the course of producing the multilayer ceramic substrate illustrated in FIG. 1.

The green sheets are stacked, whereby a multilayer green sheet (non-fired) is produced. FIG. 2 is a schematic cross-sectional view of a multilayer green sheet (non-fired) produced in the course of producing the multilayer ceramic substrate illustrated in FIG. 1. As illustrated in FIG. 2, a multilayer green sheet 21 includes multiple (five in FIG. 2) green sheets 22. The green sheets 22 are to be the glass ceramic layers 3 after firing. The multilayer green sheet 21 may be provided with conductive layers including the conductive layers 9, 10, and 11, as well as the via hole conductor layers 12. The conductive layers may be formed by a technique such as screen printing or photolithography using a conductive paste containing Ag or Cu.

(D) Firing of Multilayer Green Sheet

The multilayer green sheet 21 is fired. As a result, the multilayer ceramic substrate 1 as illustrated in FIG. 1 is obtained.

The firing temperature for the multilayer green sheet 21 may be any temperature at which the glass ceramic material of the present disclosure constituting the green sheet 22 is sinterable, and may be 1000° C. or lower.

The firing atmosphere for the multilayer green sheet 21 may be any atmosphere, and is preferably the air atmosphere in the case where an oxidation-resistive material such as Ag is used for the conductive layers 9, 10, and 11, as well as the via hole conductor layers 12, or preferably an oxygen-poor atmosphere such as a nitrogen atmosphere in the case where an easily oxidative material such as Cu is used therefor. The firing atmosphere for the multilayer green sheet 21 may be a reduced atmosphere.

The multilayer green sheet 21 may be fired while sandwiched between constraining green sheets. The constraining green sheets each contain as a main component an inorganic material (e.g., $Al_2O_3$) that is substantially unsinterable at the sintering temperature for the glass ceramic material of the present disclosure constituting the green sheets 22. Thus, the constraining green sheets do not shrink during firing of the multilayer green sheet 21 but act to reduce shrinkage of the multilayer green sheet 21 in the main surface direction. This results in an increased dimensional accuracy of the resulting multilayer ceramic substrate 1 (especially, the conductive layers 9, 10, and 11 as well as the via hole conductor layers 12).

Electronic Component

The electronic component of the present disclosure includes a multilayer ceramic substrate including the laminate of the present disclosure and a chip component mounted on the multilayer ceramic substrate.

The multilayer ceramic substrate 1 may be provided with chip components 13 and 14 each in electrical connection with a target conductive layer 10. This constitutes an electronic component 2 including the multilayer ceramic substrate 1.

Examples of the chip components 13 and 14 include an LC filter, a capacitor, and an inductor.

The electronic component 2 may be mounted on a board (e.g., motherboard) so as to be in electrical connection via the conductive layer 11.

The example described above is an example where the laminate of the present disclosure is applied to a multilayer ceramic substrate. Alternatively, the laminate of the present disclosure may be applied to a chip component to be mounted on a multilayer ceramic substrate. The laminate of the present disclosure may also be applied to those other than the multilayer ceramic substrate and the chip component.

Examples

The following provides examples that more specifically disclose the glass ceramic material and laminate of the present disclosure. The present disclosure is not limited to these examples.

(A) Preparation of Glass Ceramic Material

Glasses G1 to G7 (each in the form of powder) having the respective compositions shown in Table 1 were prepared by the following method. First, glass material powders were mixed, put into a Pt crucible, and melted at 1650° C. for six hours or longer in the air atmosphere. The resulting melt was then rapidly cooled, whereby cullet was produced. The material of $K_2O$, which was an alkali metal oxide, in Table 1 used was a carbonate. The $K_2O$ content in Table 1 indicates the proportion of the carbonate in an oxide equivalent. The cullet was coarsely pulverized and put into a container together with ethanol and PSZ balls (diameter: 5 mm). Then, the contents were mixed using a ball mill. The pulverization duration in the mixing with the ball mill was adjusted, whereby a glass powder having a central particle size of 1

µm was obtained. The "central particle size" herein means the central particle size $D_{50}$ measured by laser diffraction/scattering analysis.

TABLE 1

| Glass | Composition (wt %) | | | |
|---|---|---|---|---|
| | $SiO_2$ | $B_2O_3$ | $Al_2O_3$ | $K_2O$ |
| G1 | 80.0 | 17.6 | 0.7 | 1.7 |
| G2 | 72.0 | 26.0 | 0.5 | 1.5 |
| G3 | 88.0 | 10.0 | 0.5 | 1.5 |
| G4 | 80.6 | 17.6 | 0.1 | 1.7 |
| G5 | 78.7 | 17.6 | 2.0 | 1.7 |
| G6 | 80.7 | 17.6 | 0.7 | 1.0 |
| G7 | 78.7 | 17.6 | 0.7 | 3.0 |

Next, based on the composition shown in Table 2, the glass powder, quartz powder, $Al_2O_3$ powder, and $ZrO_2$ powder (central particle size of each powder: 1 µm) were put into ethanol and mixed using a ball mill. Thereby, a glass ceramic material was prepared.

(B) Production of Green Sheet

The glass ceramic material, a binder solution of polyvinyl butyral dissolved in ethanol, and a dioctyl phthalate (DOP) solution serving as a plasticizer were mixed, whereby ceramic slurry was prepared. The ceramic slurry was then applied in a pattern to a polyethylene terephthalate film using a doctor blade and dried at 40° C. Thereby, each of 50-µm-thick green sheets S1 to S19 was produced.

TABLE 2

| Green sheet | Composition (wt %) | | | |
|---|---|---|---|---|
| | Glass | Filler | | |
| | | Quartz | $Al_2O_3$ | $ZrO_2$ |
| S1 | G1 | 62.4 | 34.0 | 2.7 | 0.9 |
| S2 | G2 | 62.4 | 34.0 | 2.7 | 0.9 |
| S3 | G3 | 62.4 | 34.0 | 2.7 | 0.9 |
| S4 | G4 | 62.4 | 34.0 | 2.7 | 0.9 |
| S5 | G5 | 62.4 | 34.0 | 2.7 | 0.9 |
| S6 | G6 | 62.4 | 34.0 | 2.7 | 0.9 |
| S7 | G7 | 62.4 | 34.0 | 2.7 | 0.9 |
| S8 | G1 | 69.4 | 27.0 | 2.7 | 0.9 |
| S9 | G1 | 67.4 | 29.0 | 2.7 | 0.9 |
| S10 | G1 | 57.4 | 39.0 | 2.7 | 0.9 |
| S11 | G1 | 55.4 | 41.0 | 2.7 | 0.9 |
| S12 | G1 | 63.3 | 34.0 | 1.8 | 0.9 |
| S13 | G1 | 60.1 | 34.0 | 5.0 | 0.9 |
| S14 | G1 | 59.1 | 34.0 | 6.0 | 0.9 |
| S15 | G1 | 63.2 | 34.0 | 2.7 | 0.1 |
| S16 | G1 | 63.0 | 34.0 | 2.7 | 0.3 |
| S17 | G1 | 61.3 | 34.0 | 2.7 | 2.0 |
| S18 | G1 | 60.3 | 34.0 | 2.7 | 3.0 |
| S19 | G1 | 61.5 | 34.0 | 2.7 | 1.8 |

The steps (A) and (B) are common to the following production of evaluation samples. In contrast, the subsequent steps (i.e., (C) Production of multilayer green sheet and (D) Firing of multilayer green sheet) are described for each evaluation sample.

Evaluation of Sinterability and Coefficient of Thermal Expansion (C) Production of Multilayer Green Sheet For each of the green sheets S1 to S19, the green sheet was cut into 50-mm-square pieces and 20 pieces thereof were stacked. The stack was put into a mold and compressed using a press, whereby a multilayer green sheet was produced.

(D) Firing of Multilayer Green Sheet

Each multilayer green sheet was cut into a cuboid having a size of 15 mm×5 mm and fired at 990° C. for 30 minutes in a reduced atmosphere. As a result, evaluation samples of Examples 1 to 13 and Comparative Examples 1 to 6 were obtained as shown in Table 3.

For the evaluation samples of the respective examples, the sinterability was evaluated by checking whether the cut surface was impregnated and colored with ink. The results are shown in Table 3. The evaluation criteria are as follows. Good: The cut surface was neither impregnated nor colored with ink. Poor: The cut surface was impregnated and colored with ink.

For the evaluation samples having good sinterability, the average coefficient of thermal expansion within a temperature range of 20° C. or higher and 600° C. or lower was determined using a thermomechanical analyzer. The results are shown in Table 3. For the evaluation criteria, those having an average coefficient of thermal expansion (expressed as coefficient of thermal expansion in Table 3) of 8 ppm/K or higher were evaluated as having a high coefficient of thermal expansion.

Evaluation of Permittivity and Dielectric Loss (C) Production of Multilayer Green Sheet For each of the green sheets S1 to S19, the green sheet was cut into 50-mm-square pieces and 15 pieces thereof were stacked. The stack was put into a mold and compressed using a press, whereby a multilayer green sheet was produced.

(D) Firing of Multilayer Green Sheet

Each multilayer green sheet was fired at 980° C. for 60 minutes in a reduced atmosphere. As a result, evaluation samples of Examples 1 to 13 and Comparative Examples 1 to 6 were obtained as shown in Table 3.

For the evaluation samples of the respective examples, the thickness was measured and the relative permittivity and dielectric loss under 6 GHz conditions were measured by the perturbation method. The reciprocal of the dielectric loss measured was taken as the Q value. The results are shown in Table 3. For the evaluation criteria, those having a relative permittivity of 4.5 or lower were evaluated as having a low permittivity and those having a Q value of 180 or higher were evaluated as having a low dielectric loss.

Evaluation of Flexural Strength (C) Production of Multilayer Green Sheet

For each of the green sheets S1 to S19, the green sheet was cut into 50-mm-square pieces and 15 pieces thereof were stacked. The stack was put into a mold and compressed using a press, whereby a multilayer green sheet was produced. Twenty multilayer green sheets of this specification were prepared.

(D) Firing of Multilayer Green Sheets

Each of the 20 multilayer green sheets was cut into a cuboid having a size of 5 mm×40 mm. The resulting 20 samples were fired at 980° C. for 60 minutes in a reduced atmosphere. As a result, evaluation samples (each 20 pieces) of Examples 1 to 13 and Comparative Examples 1 to 6 were obtained as shown in Table 3.

For the evaluation samples (each 20 pieces) of the respective examples, the thickness and the width were measured and the average flexural strength was measured using a 3-point bending tester. The results are shown in Table 3. For the evaluation criteria, those having an average flexural strength (expressed as flexural strength in Table 3) of 160 MPa or higher were evaluated as having a high flexural strength (high mechanical strength).

Evaluation of Precipitation of Cristobalite Crystals

The evaluation samples used in the aforementioned "Evaluation of permittivity and dielectric loss" and "Evaluation of flexural strength" were pulverized. As a result, evaluation samples of Examples 1 to 13 and Comparative Examples 1 to 6 were obtained as shown in Table 3.

For the evaluation samples of the respective examples, whether cristobalite crystals precipitated or not was examined from X-ray diffraction peaks. The results are shown in Table 3. The evaluation criteria are as follows. Good: No cristobalite crystals precipitated. Poor: Cristobalite crystals precipitated.

Evaluation of Insulation Reliability (C) Production of Multilayer Green Sheet

Figure 3:
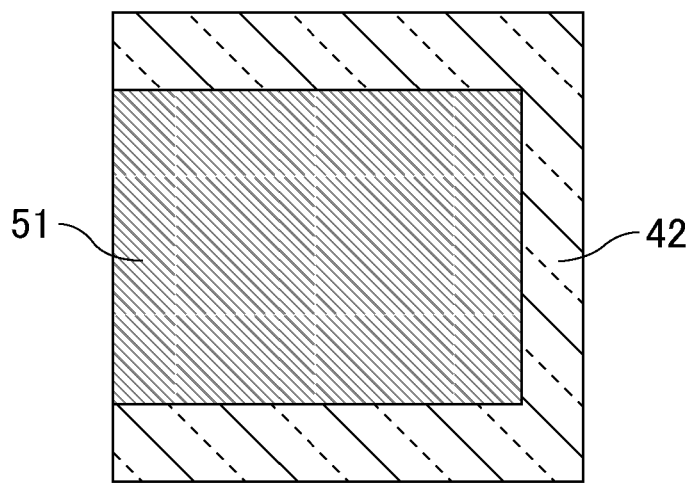
FIG. 3 is a schematic plan view of a green sheet constituting a sample for evaluating the insulation reliability.

FIG. 3 is a schematic plan view of a green sheet constituting a sample for evaluating the insulation reliability. For each of the green sheets S1 to S19, the green sheet was first cut into a 20-mm-square piece, whereby a green sheet 42 as shown in FIG. 3 was obtained. Using a screen printing plate and Cu paste, a conductive layer 51 having a pattern as shown in FIG. 3 was printed on the green sheet 42.

Figure 4:
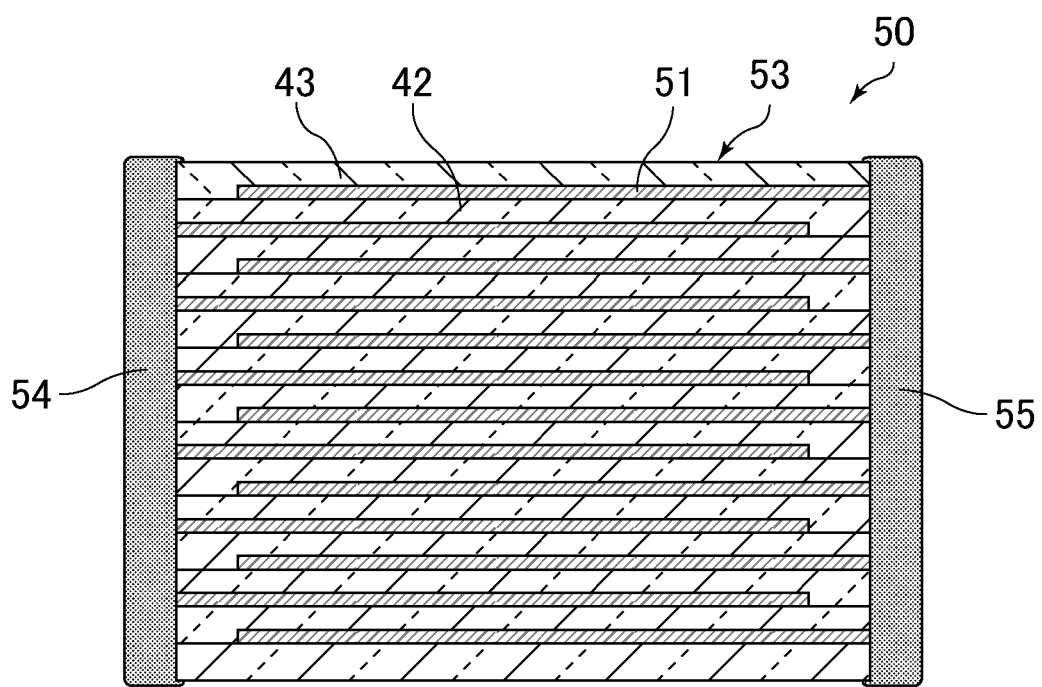
FIG. 4 is a schematic cross-sectional view of a multilayer green sheet (non-fired) produced in the course of producing a sample for evaluating the insulation reliability.
Figure 5:
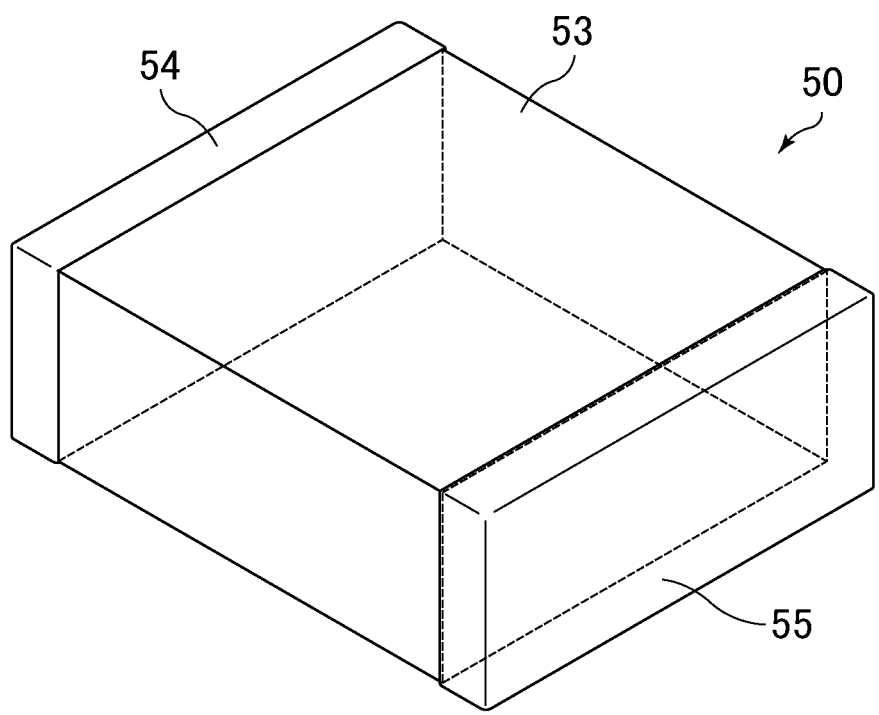
FIG. 5 is a schematic perspective view of a multilayer green sheet (non-fired) produced in the course of producing a sample for evaluating the insulation reliability.

FIG. 4 is a schematic cross-sectional view of a multilayer green sheet (non-fired) produced in the course of producing a sample for evaluating the insulation reliability. FIG. 5 is a schematic perspective view of a multilayer green sheet (non-fired) produced in the course of producing a sample for evaluating the insulation reliability. Then, as illustrated in FIG. 4, 13 green sheets 42 each having the conductive layer 51 printed thereon was stacked while the pattern orientation was alternately changed by 180°. Thereon was stacked a green sheet 43 having no conductive layer printed thereon. Thereby, a sheet stack 53 was produced. The sheet stack 53 was put into a mold and compressed using a press, and Cu paste was then applied to the sides thereof. Thereby, opposite electrode layers 54 and 55 as illustrated in FIGS. 4 and 5 were formed. As a result, a multilayer green sheet 50 was obtained.

(D) Firing of Multilayer Green Sheet

The multilayer green sheet 50 was fired at 980° C. for 60 minutes in a nitrogen atmosphere. As a result, evaluation samples (evaluation samples each having a multilayer capacitor structure) of Examples 1 to 13 and Comparative Examples 1 to 6 were obtained as shown in Table 3.

The evaluation samples of the respective examples were subjected to testing in which each sample was left to stand in a constant-temperature and constant-humidity test bath at a temperature of 85° C. and a humidity of 85% for 1000 hours while a voltage of 50 V was applied between the electrode layers 54 and 55. The test was followed by measurement of the insulation resistance. The results are shown in Table 3. The evaluation criteria are as follows. Good: The insulation resistance was $10^{10} \Omega$ or higher. Poor: The insulation resistance was lower than $10^{10} \Omega$.

TABLE 3

| | Green sheet | Sinterability | Coefficient of thermal expansion (ppm/K) | Relative permittivity | Q value | Flexural strength (MPa) | Precipitation of cristobalite crystals | Insulation reliability |
|---|---|---|---|---|---|---|---|---|
| Example 1 | S1 | Good | 9.5 | 3.9 | 380 | 260 | Good | Good |
| Example 2 | S2 | Good | 8.7 | 4.0 | 290 | 210 | Good | Good |
| Example 3 | S3 | Good | 9.7 | 3.9 | 360 | 200 | Good | Good |
| Example 4 | S4 | Good | 9.7 | 3.9 | 380 | 180 | Good | Good |
| Example 5 | S5 | Good | 10.3 | 4.5 | 280 | 200 | Good | Good |
| Example 6 | S6 | Good | 9.3 | 4.0 | 350 | 200 | Good | Good |
| Example 7 | S7 | Good | 9.5 | 4.4 | 180 | 240 | Good | Good |
| Example 8 | S9 | Good | 8.0 | 4.0 | 220 | 230 | Good | Good |
| Example 9 | S10 | Good | 10.9 | 4.0 | 260 | 170 | Good | Good |
| Example 10 | S12 | Good | 10.8 | 4.0 | 310 | 190 | Good | Good |
| Example 11 | S13 | Good | 9.6 | 4.4 | 180 | 320 | Good | Good |
| Example 12 | S16 | Good | 10.7 | 4.1 | 260 | 180 | Good | Good |
| Example 13 | S19 | Good | 10.2 | 4.2 | 190 | 280 | Good | Good |
| Comparative Example 1 | S8 | Good | 7.9 | 4.0 | 200 | 220 | Good | Poor |
| Comparative Example 2 | S11 | Good | 11.2 | 3.9 | 270 | 150 | Good | Poor |
| Comparative Example 3 | S14 | Good | 9.0 | 4.6 | 150 | 330 | Good | Good |
| Comparative Example 4 | S15 | Good | 11.0 | 4.0 | 290 | 150 | Poor | Good |
| Comparative Example 5 | S18 | Good | 9.9 | 4.4 | 150 | 330 | Good | Good |
| Comparative Example 6 | S17 | Good | 10.0 | 4.3 | 170 | 300 | Good | Good |

Table 3 demonstrates that Examples 1 to 13 achieved a low permittivity, low dielectric loss, high mechanical strength, and high coefficient of thermal expansion. Further, Examples 1 to 13 exhibited no precipitation of cristobalite crystals and achieved excellent insulation reliability.

The glass ceramic material in Comparative Example 1 contained more than 67.4% by weight of the glass and less than 29% by weight of the quartz in the filler, resulting in a low coefficient of thermal expansion and poor insulation reliability.

The glass ceramic material in Comparative Example 2 contained less than 57.4% by weight of the glass and more than 39% by weight of the quartz in the filler, resulting in a low flexural strength and poor insulation reliability.

The glass ceramic material in Comparative Example 3 contained more than 5% by weight of the $Al_2O_3$ in the filler, resulting in a high relative permittivity (high permittivity) and a low Q value (high dielectric loss).

The glass ceramic material in Comparative Example 4 contained less than 0.3% by weight of the $ZrO_2$ in the filler, resulting in a low flexural strength and precipitation of cristobalite crystals.

The glass ceramic material in Comparative Example 5 contained more than 1.8% by weight of the $ZrO_2$ in the filler, resulting in a low Q value (high dielectric loss).

The glass ceramic material in Comparative Example 6 contained more than 1.8% by weight of the $ZrO_2$ in the filler, resulting in a low Q value (high dielectric loss).

1: multilayer ceramic substrate
2: electronic component
3: glass ceramic layer
9, 10, 11, 51: conductive layer
12: via hole conductor layer
13, 14: chip component
21, 50: multilayer green sheet
22, 42, 43: green sheet
53: sheet stack
54, 55: electrode layer

The invention claimed is:

1. A glass ceramic material comprising:
   a glass containing $SiO_2$, $B_2O_3$, $Al_2O_3$, and $M_2O$, wherein M is an alkali metal; and
   a filler containing quartz, $Al_2O_3$, and $ZrO_2$,
   the glass ceramic material containing the glass in an amount of 57.4% by weight or more and 67.4% by weight or less, the quartz in the filler in an amount of 29% by weight or more and 39% by weight or less, the $Al_2O_3$ in the filler in an amount of 1.8% by weight or more and 5% by weight or less, and the $ZrO_2$ in the filler in an amount of 0.3% by weight or more and 1.8% by weight or less.

2. The glass ceramic material according to claim 1, wherein the glass contains the $SiO_2$ in an amount of 72% by weight or more and 88% by weight or less, the $B_2O_3$ in an amount of 10% by weight or more and 26% by weight or less, the $Al_2O_3$ in an amount of 0.1% by weight or more and 2% by weight or less, and the $M_2O$ in an amount of 1% by weight or more and 3% by weight or less.

3. The glass ceramic material according to claim 1, wherein the glass ceramic material is free from cristobalite crystals.

4. A laminate comprising multiple glass ceramic layers each of which is a sintered article of the glass ceramic material according to claim 1.

5. An electronic component comprising:
   a multilayer ceramic substrate including the laminate according to claim 4; and
   a chip component mounted on the multilayer ceramic substrate.

6. The glass ceramic material according to claim 2, wherein the glass ceramic material is free from cristobalite crystals.

7. A laminate comprising multiple glass ceramic layers each of which is a sintered article of the glass ceramic material according to claim 2.

8. A laminate comprising multiple glass ceramic layers each of which is a sintered article of the glass ceramic material according to claim 3.

* * * * *